(12) United States Patent
Chen et al.

(10) Patent No.: US 11,448,956 B2
(45) Date of Patent: Sep. 20, 2022

(54) EUV MASK

(71) Applicant: TAIWAN SEMICONDUCTOR MANUFACTURING CO., LTD., Hsinchu (TW)

(72) Inventors: Ching-Huang Chen, New Taipei (TW); Chi-Yuan Sun, New Taipei (TW); Hua-Tai Lin, Hsinchu (TW); Hsin-Chang Lee, Zhubei (TW); Ming-Wei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 327 days.

(21) Appl. No.: 16/562,400

(22) Filed: Sep. 5, 2019

(65) Prior Publication Data
US 2021/0072633 A1    Mar. 11, 2021

(51) Int. Cl.
*G03F 1/24* (2012.01)
*H01L 21/033* (2006.01)

(52) U.S. Cl.
CPC ............ *G03F 1/24* (2013.01); *H01L 21/0332* (2013.01); *H01L 21/0337* (2013.01)

(58) Field of Classification Search
CPC ..... G03F 1/24; G03F 1/48; G03F 1/54; G03F 7/70233; H01L 21/0332; H01L 21/0337
USPC .......................................................... 430/5
See application file for complete search history.

(56) References Cited

U.S. PATENT DOCUMENTS

| | | |
|---|---|---|
| 7,599,112 B2 | 10/2009 | Shiraishi |
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 2003/0147058 A1 | 8/2003 | Murakami et al. |
| 2010/0060870 A1* | 3/2010 | Dziomkina ....... C23C 16/45555 355/30 |
| 2015/0064611 A1* | 3/2015 | Shih .......................... G03F 1/24 430/5 |
| 2016/0011344 A1 | 1/2016 | Beasley et al. |

(Continued)

FOREIGN PATENT DOCUMENTS

| | | |
|---|---|---|
| CN | 1379284 A | 11/2002 |
| TW | 201743127 A | 12/2017 |
| TW | I655458 B | 4/2019 |

*Primary Examiner* — Caleen O Sullivan
(74) *Attorney, Agent, or Firm* — McDermott Will & Emery LLP

(57) ABSTRACT

A reflective mask includes a substrate, a reflective multilayer disposed on the substrate, a capping layer disposed on the reflective multilayer, a photo catalytic layer disposed on the capping layer, and an absorber layer disposed on the photo catalytic layer and carrying circuit patterns having openings. Part of the photo catalytic layer is exposed at the openings of the absorber layer, and the photo catalytic layer includes one selected from the group consisting of titanium oxide ($TiO_2$), tin oxide (SnO), zinc oxide (ZnO) and cadmium sulfide (CdS).

20 Claims, 11 Drawing Sheets

(56) References Cited

U.S. PATENT DOCUMENTS

| | | | |
|---|---|---|---|
| 2016/0124297 A1* | 5/2016 | Hsieh | G03F 7/702 355/67 |
| 2016/0178996 A1* | 6/2016 | Shih | G03F 1/72 430/5 |
| 2017/0351169 A1 | 12/2017 | Yu et al. | |
| 2019/0079384 A1* | 3/2019 | Chan | G03F 1/48 |

* cited by examiner

EUV MASK

BACKGROUND

The wavelength of radiation used for lithography in semiconductor manufacturing has decreased from ultraviolet to deep ultraviolet (DUV) and, more recently to extreme ultraviolet (EUV). Further decreases in component size require further improvements in the resolution of lithography which are achievable using extreme ultraviolet lithography (EUVL). EUVL employs radiation having a wavelength of about 1-100 nm, e.g., 13.5 nm. Since a projection lens type exposure apparatus cannot be used in an EUV lithography, an all-reflective optical system is required in EUV lithography. Accordingly, an EUV reflective structure (reflector, such as a mirror) having a high reflectance is one of the key technologies in the EUV lithography. A reflective mask is used during EUV lithography process to form an integrated circuit having smaller feature size. However, existing reflective masks are vulnerable to manufacturing fabrication defects, such as oxidation, and are easily damaged. Therefore, what is needed a reflective mask and method of making the same to address the above issues.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1A:
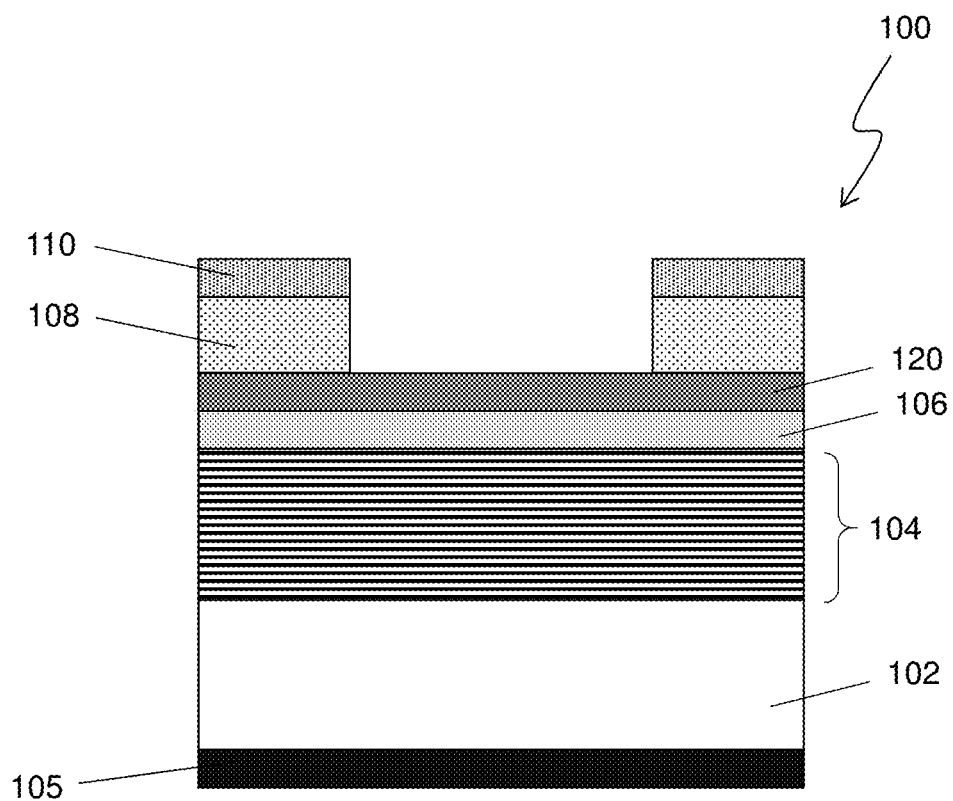
FIG. 1A is a cross sectional view of a reflective photo mask used in an extreme ultraviolet (EUV) lithography exposing tool in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to an extreme ultraviolet (EUV) reflector, such as a EUV reflective photo mask. In the following embodiments, materials, configuration, dimensions, processes and/or method explained with respect to one embodiments can be applied to other embodiments, and the detailed description thereof may be omitted.

Figure 1B:
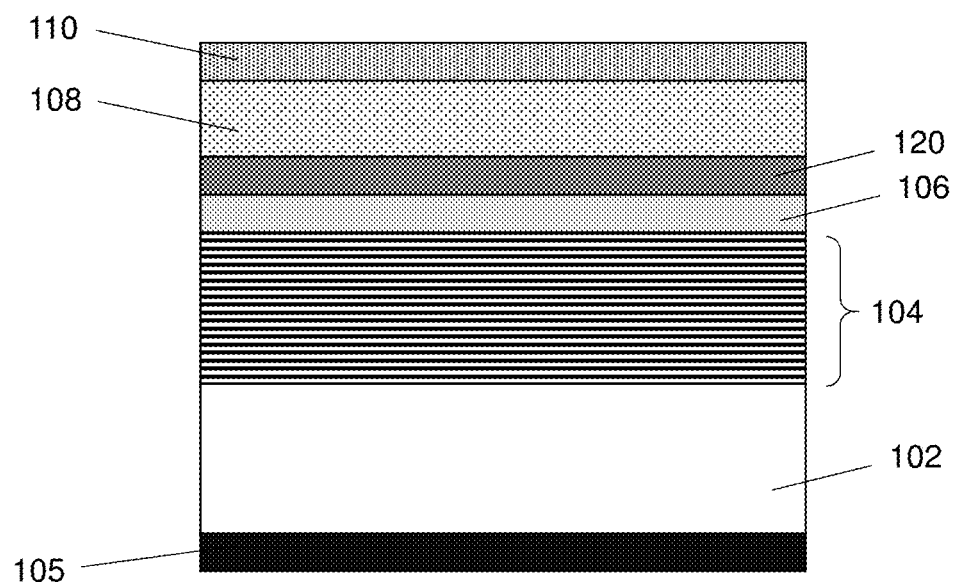
FIG. 1B is a cross sectional view of a mask blank for the reflective photo mask of FIG. 1A.

FIG. 1A is a sectional view of a reflective photo mask (or reflective reticle or reflective mask) 100 used in an extreme ultraviolet (EUV) lithography exposing tool constructed according to one or more embodiments of the present disclosure. FIG. 1B is a cross sectional view of a mask blank for the reflective photo mask of FIG. 1A.

The EUV reflective mask 100 includes a substrate 102. The substrate 102 is chosen to minimize image distortion due to mask heating by the intensified illumination radiation. In some embodiments, the substrate 102 includes a low thermal expansion material (LTEM). The LTEM includes fused quartz, silicon carbide, silicon oxide-titanium oxide alloy and/or other suitable LTEM known in the art. Alternatively, the substrate 102 includes other materials, such as quartz or glass, depending on design requirements of the mask. The substrate 102 includes materials with a low defect level and a smooth surface. In some embodiments, the size of the substrate 102 is a 6-inch substrate, i.e., 152 mm×152 mm.

The EUV reflective mask 100 includes a reflective multilayer (RML) 104 deposited on the substrate 102. The RML 104 is designed to reflect of the radiation light directed to the substrate 102. In one embodiment, the RML 104 includes alternating layers of two materials deposited on the top of the substrate 102 to act as a Bragg reflector that maximizes the reflection of the radiation light, such as EUV with 13.5 nm wavelength.

The combination of the two materials in the alternating layers is selected to provide a large difference in refractive indices between the two layers (for example, to achieve large reflectivity at an interface of the two layers according to Fresnel equations), yet provides small extinction coefficients for the layers (for example, to minimize absorption). In some embodiments, the RML 104 includes molybdenum-silicon (Mo/Si) layer pairs. In other embodiments, the RML 104 includes molybdenum-beryllium (Mo/Be) layer pairs. A thickness of each layer of each layer pair of the RML 104 is adjusted depending on a wavelength and an angle of incidence of light (such as extreme ultraviolet (EUV) radiation) incident on the EUV reflective mask, such that the mask achieves maximum constructive interference of light reflected from different interfaces of the RML 104. In general, reflectivity of the RML 104 increases as a number of layer pairs of the RML increases. Accordingly, in principle, if the number of layer pairs is sufficiently large and extinction coefficients of the materials of the layers are close to zero, the reflectivity of the RML 104 can approach 100% regardless of the difference of the refractive indices of the materials of the layers in the layer pairs. However, in the EUV wavelength range, the highest reflectivity that can be achieved is limited by the extinction coefficients of the materials employed for the layers of the RML 104. In some embodiments, the number of layer pairs of the RML 104 is from twenty to eighty. In certain embodiments, to achieve more than 90% of the maximum achievable reflectivity (with the chosen materials) of the RML 104 and minimize mask blank manufacturing time and costs, the RML 104 includes about forty layer pairs, such as forty Mo/Si pairs. In some embodiments, the Mo/Si pairs includes a silicon layer having a thickness of 3 nm to 5 nm (for example, about 4 nm), and a molybdenum layer having a thickness of 2 nm to 4 nm (for example, about 3 nm). In certain embodiments, the RML 104 includes about 40 Mo/Si film pairs, and each Mo/Si film pair has a collective thickness of about 7 nm. Alternatively, the RML 104 includes any other number of layer pairs, depending on reflectivity specifications for the mask.

A capping layer 106 is deposited on the RML 104. Because the capping layer 106 has different etching characteristics from an absorber layer, the capping layer 106 provides protection to the RML 104. At the same time, the capping layer will not degrade the EUV reflectivity from the RML 104. In some embodiments, the capping layer 106 is made of Ru or a Ru alloy. In some embodiments, the capping layer 106 includes alloy of ruthenium and a suitable metal "M" (RuM alloy), in which the metal "M" is highly oxygen unreactive. In some embodiments, the RuM alloy of the capping layer 106 is in an amorphous structure. In some examples, the capping layer 106 includes an alloy of Ru and platinum (Pt) (RuPt alloy). In some embodiments, the metal "M" of RuM alloy is one of Po, Hg, Os, Rh, Pd, Jr, Nb, and Pt or a combination thereof. The thickness of the capping layer 106 ranges between about 2 nm and about 5 nm in some embodiments.

In some embodiments, the capping layer 106 is made of Si. In some embodiments, a Si layer is formed on the RML 104. In other embodiments, the topmost layer of the RML 104 is a Si layer having a thickness larger than the thickness of the other Si layers of the RML 104. In some embodiments, the top Si layer has a thickness in a range from about 5 nm to about 15 nm.

Contamination and/or oxidation of the mask may come from various sources, such as dry plasma-oxygen assisted etching, environmental moisture, mask repairing, EUV exposure, and mask cleaning. For example, it was observed that the oxidative media used in EUV mask cleaning will strongly oxidize the RML 104 and change the local silicon of the RML 104 to silica, which causes a deformation of the RML 104 of the EUV reflective mask 100. Furthermore, the chemicals used in electron-beam-based mask repair also induce a strong oxidation in the local surface, which causes deformation of the RML 104. The existing capping layer does not provide enough resistance to degradation from dry plasma-oxygen assisted etching, environmental oxidation contamination, mask repairing and cleaning oxidation process. In addition, chemicals used in cleaning operations may remain as residues, such as hydrocarbon residues, on the mask. The hydrocarbon residue is also deposited on the mask during EUV exposure due to remaining hydrocarbon in an EUV chamber. One of the sources of the hydrocarbon residue may be a photo resist (organic material) coated on a wafer. The hydrocarbon residue is removed by plasma treatment, which may also damage the mask.

In some embodiments of the present disclosure, a photo catalytic layer 120 is deposited on the capping layer 106. The photo catalytic layer 120 catalyzes the hydrocarbon residues into $CO_2$ and/or $H_2O$ with EUV radiation. Thus an in-situ self-cleaning of the mask surface is performed. In some embodiments, In the EUV scanner system, oxygen and hydrogen gases are injected into the EUV chamber to maintain the chamber pressure (e.g., at about 2 Pa). The chamber background gas can be a source of oxygen. In addition to the photo catalytic function, the photo catalytic layer 120 is designed to have sufficient durability and resistance to various chemicals and various chemical processes, such as cleaning and etching. In some examples, the ozonated water used to make the EUV reflective mask 100 in the subsequent process introduces damage to the capping layer 106 made of Ru and results in a significant EUV reflectivity drop. It was further observed that after Ru oxidation, Ru oxide is easily etched away by an etchant, such as $Cl_2$ or $CF_4$ gas.

In addition, the photo catalyst layer 120 functions as an etching stop layer during a patterning operation of an absorber layer. In the various embodiments, the photo catalytic layer 120 is designed and formed with those considerations to address identified issues.

In some embodiments, when the photo catalytic layer 120 is formed to be amorphous, the polycrystalline structure in the photo catalytic layer 120 includes grain morphology.

In some embodiments, the photo catalytic layer 120 includes one or more of titanium oxide ($TiO_2$), tin oxide (SnO), zinc oxide (ZnO) and cadmium sulfide (CdS). In some embodiments, the photo catalytic layer 120 is formed by chemical vapor deposition (CVD), physical vapor deposition (PVD) including sputtering, atomic layer deposition (ALD), or any other suitable film formation methods. In some embodiments, a metal layer (e.g., Ti, Sn and/or Zn) is formed on the capping layer 106 and a plasma treatment of the deposited layer using a gas containing oxygen is performed to form an oxide layer thereof. The plasma treatment is controlled such that dopant is only introduced to the photo catalytic layer 120 and/or the capping layer without being further introduced to the RML 104. The thickness of the photo catalytic layer 120 is in a range from about 2 nm to about 10 nm in some embodiments, and is in a range from about 3 nm to about 7 nm in other embodiments. When the thickness is too thin, the photo catalytic layer may not sufficiently function as an etch stop layer. When the thickness is too large, the photo catalytic layer may absorb the EUV radiation.

Still referring to FIGS. 1A and 1B, the EUV reflective mask 100 includes an absorber layer 108 formed on the photo catalytic layer 120. The absorber layer 108 is deposited on the photo catalytic layer 120 and is further patterned to define a circuit pattern thereon, such as according to an IC design layout. Although only one opening is shown in the EUV mask 100 of FIG. 1A, there are multiple openings formed by the absorber layer 108 corresponding to the circuit patterns.

The absorber layer 108 is designed to absorb radiation light (such as EUV light) during a lithography exposing process. The radiation light passes through the openings of the absorber layer 108 and is reflected by the RML 104, thus the circuit pattern is imaged to a photo resist layer formed over a substrate. In some embodiments, the absorber layer 108 includes tantalum boron nitride (TaBN). In other embodiments, the absorber layer 108 includes chromium (Cr), chromium oxide (CrO), titanium nitride (TiN), tantalum nitride (TaN), tantalum (Ta), TaHf, TaGe, tantalum and silicon-based materials (e.g., TaSiON, TaBSi), tantalum boron oxide-based materials (e.g., TaBO), titanium (Ti), or aluminum-copper (Al—Cu), palladium, aluminum oxide (AlO), molybdenum (Mo), and other suitable materials. In yet another embodiment, the absorber layer 108 includes multiple layers. In certain embodiments, the absorber layer 108 includes a first layer made of TaBN and a second layer made of TaBO formed on the first layer. In some embodiments, the second layer has a smaller thickness than the first layer. In some embodiments, the absorber layer 108 is deposited by a deposition technique, such as CVD, PVD, or ALD, and is patterned by a suitable procedure, such as electron-beam lithography process and etching.

In some embodiments, the EUV reflective mask 100 optionally includes a protection layer 110 disposed on the absorber layer 108. In some embodiments, the protection layer 110 may protect the absorber layer 108 from oxidation when the mask is in cleaning process. Furthermore, in some embodiments, the absorber layer 108 has poor clean resistance and the protection layer 110 enhances the cleaning durability.

The protection layer 110 is chosen to provide effective protection to the absorber layer 108, such as protection from oxidation, etching or damaging during subsequent processes that include etching and cleaning. In some embodiments, the protection layer 110 is similar to the capping layer 106 in term of composition. In various embodiments, the protection layer 110 includes Ru, Ru alloy, oxidized or nitrogenized Ti, Zr or Si, or other suitable material. In other embodiments, some other material may be used to form the protection layer 110. In one embodiment, a SiC film is formed as the protection layer 110.

The protection layer 110 is also patterned such that it is disposed only on the patterned absorber layer 108. In some embodiments, the absorber layer 108 is deposited first and then the protection layer 110 is deposited on the absorber layer 108. Then a patterning operation, including one or more lithography and etching operations is applied to pattern both the absorber layer 108 and the protection layer 110. The etching may include one etch step, such as a dry etching, or two etch steps, such as two wet and/or dry etch steps, to sequentially pattern the absorber layer 108 and the protection layer 110.

In some embodiments, the protection layer 110 is an antireflective layer. The material for the antireflective layer is one or more of Ta, TaO, TaON, TaHfO, TaBSiO and SiON in some embodiments. In some embodiments, the thickness of the antireflective layer is in a range from about 1 nm to about 20 nm and is in a range from about 3 nm to about 10 nm in other embodiments. In some embodiments, a different antireflective layer is formed on the protection layer 110.

In some embodiments, a conductive backside coating layer 105 is optionally deposited on the backside surface of the mask substrate 102 opposite to the front surface. The conductive backside coating layer 105 is used to fix the mask for photolithographic operation by electrostatic chucking in some embodiments. In an embodiment, the conductive layer 105 is formed of a compound including chromium nitride or any suitable material for electrostatic chucking of the mask.

Figure 2:
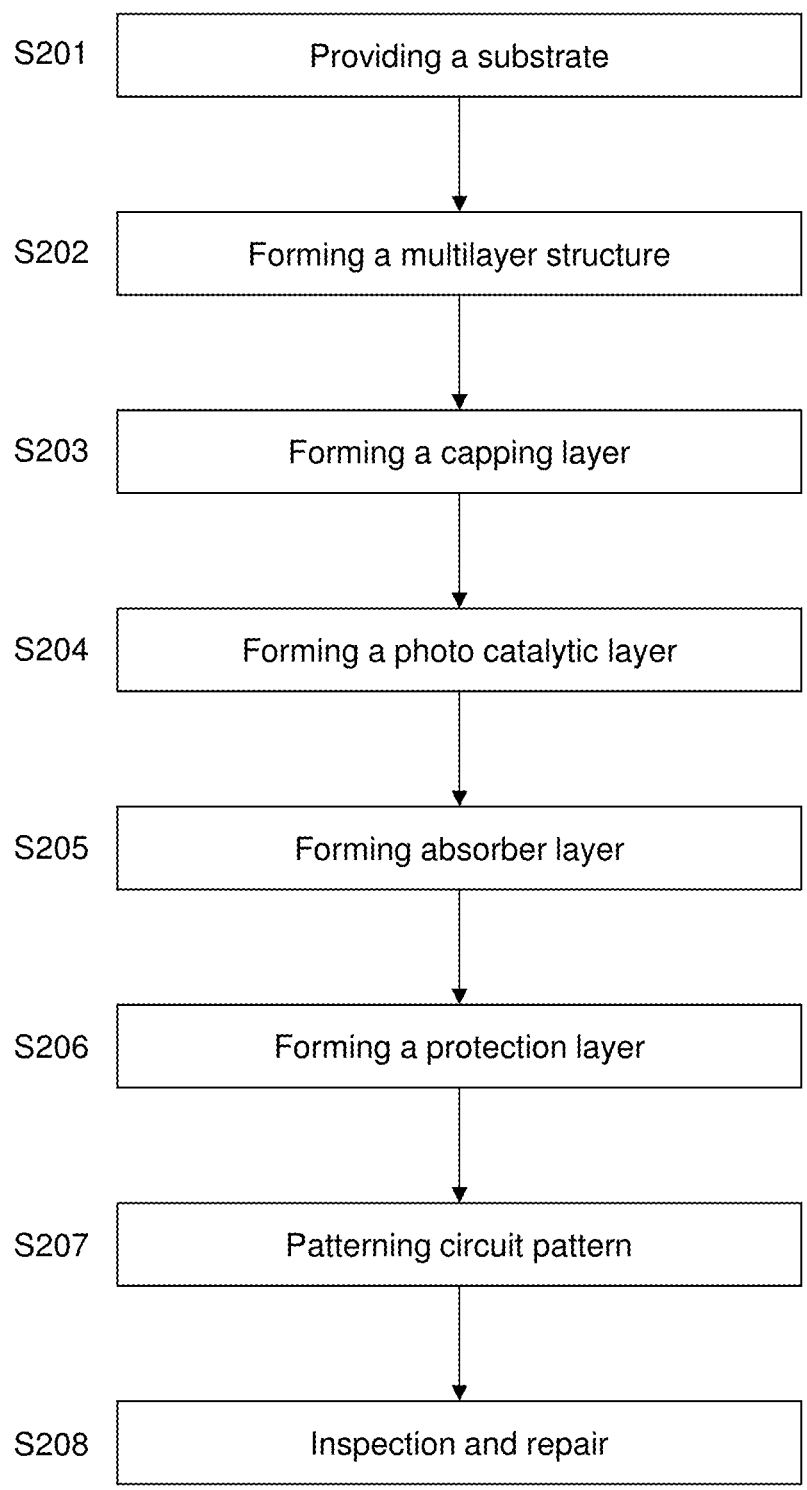
FIG. 2 is a flow chart of a sequential manufacturing process of an EUV reflective mask in accordance with embodiments of the present disclosure.

FIG. 2 is a flowchart of a sequential fabrication method to form an EUV reflective mask, such as the mask 100, according to embodiments of the present disclosure. It is understood that in the sequential manufacturing process, one or more additional operations can be provided before, during, and after the stages shown in FIG. 2 and some of the operations described below can be replaced or eliminated for additional embodiments of the method. The order of the operations/processes may be interchangeable.

At S201 of FIG. 2, a substrate 102 is provided. The substrate 102 is chosen to minimize image distortion due to mask heating by the intense illumination radiation. In the present embodiments, the substrate 102 includes a LTEM. (Original) The LTEM may include fused quartz, silicon carbide, silicon oxide-titanium oxide alloy and/or other suitable LTEM known in the art. Alternatively, the substrate 102 includes other materials, such as quartz or glass, depending on design requirements of the mask.

At S202 of FIG. 2, an RML layer 104 is formed on the substrate 102. In some embodiments, the RML layer 104 is directly formed on the substrate 102 and in other embodiments, one or more buffer layers are formed on the substrate before forming the RML layer 104. In some embodiments, the RML 104 includes alternating layers of two materials deposited on the top of the substrate 102 as set forth above. In some embodiments, the RML 104 includes molybdenum-silicon (Mo/Si) layer pairs. In other embodiments, the RML 104 includes molybdenum-beryllium (Mo/Be) layer pairs. The RML 104 is formed by PVD, CVD, ALD or other suitable technique. In some embodiments, a Mo layer is formed by sputtering using a Mo target and a Si layer is also formed by sputtering using a Si target. This processing cycle is repeated until a desired number of the Mo/Si layer pairs are formed.

At S203 of FIG. 2, a capping layer 106 is formed on the RML layer 104. The capping layer 106 is formed by PVD, CVD, ALD or other suitable technique. In some embodiments, the capping layer 106 includes Ru or a Ru alloy as set forth above.

At S204 of FIG. 2, a photo catalytic layer 120 is formed on the capping layer 106. The photo catalytic layer 120 is formed by PVD, CVD, ALD or other suitable technique. In some embodiments, the photo catalytic layer 120 includes one or more of titanium oxide ($TiO_2$), tin oxide (SnO), zinc oxide (ZnO) and cadmium sulfide (CdS) as set forth above.

At S205 of FIG. 2, an absorber layer 108 is formed on the photo catalytic layer 120. In some embodiments, the absorber layer 108 is deposited by a deposition technique, such as CVD, PVD, ALD or other suitable technique.

At S206 of FIG. 2, a protection layer 110 is formed on the absorber layer 108. In some embodiments, the protection layer 110 is deposited by a deposition technique, such as CVD, PVD, ALD or other suitable technique. After the protection layer 110 is formed, an EUV mask blank as shown in FIG. 1B is obtained. In some embodiments, the protective layer 110 is not formed.

At S207 of FIG. 2, the protection layer 110 and the absorber layer 108 are patterned by using one or more lithography and etching operations to form a circuit pattern on the EUV mask blank. The lithography operation includes coating a resist layer on the mask blank, applying a radiation beam (such as an electron-beam) to expose the resist layer, and developing the resist layer to form a patterned resist layer. The lithography process may further include other steps, such as soft baking, post-exposure-baking or hard baking. The etching operations include one or more etch steps. In some embodiments, the etching operation includes one dry etching to etch both the protection layer 110 and the absorber layer 108. In other embodiments, the etching operation includes two etching steps each using an etchant that selectively etches the respective material layer, such as the protection layer 110 or the absorber layer 108. In some embodiments, the etching conditions (etching gas, etc.) are adjusted such that the etching stops at the photo catalytic layer 120.

At S208 of FIG. 2, the patterned EUV reflective mask is subjected to inspection. If a defect is found, a repair operation is performed.

In some embodiments, before or after the circuit pattern is formed at S207, a black border pattern is formed at a peripheral region of the EUV reflective mask. The black border is a pattern-free dark area around the die (circuit area) on the mask serving as transition area between parts of the mask that are shielded from the exposure light by the reticle masking (REMA) blades and the die. When printing a die at dense spacing on an EUV scanner, the EUV light reflection from the image border overlaps edges of neighboring dies. This reflected light also contains various wavelengths that are not required, known as out-of-band (OOB) light. The OOB light adversely affects the accuracy of patterns to be formed on a substrate, in particular sections around the periphery of the pattern on the substrates. Additionally, leakage of EUV radiation occurs during exposure of adjacent dies because of residual absorber reflectivity and REMA blade instability, resulting in over exposure around die edges. To reduce this effect, a black border area is placed between adjacent dies. The black border area can solve critical dimension non-uniformity caused by neighboring die exposure.

When the EUV reflective mask 100 is used in an EUV exposure tool (e.g., an EUV scanner), the photo catalytic layer 120 is irradiated with EUV light. Thus EUV light causes a photo catalytic reaction at the surface of the photo catalytic layer 120, which decomposes hydrocarbon contamination on the mask. Such an in-situ self-cleaning maintains the reflectivity of the EUV reflective mask 100.

Figure 3A:
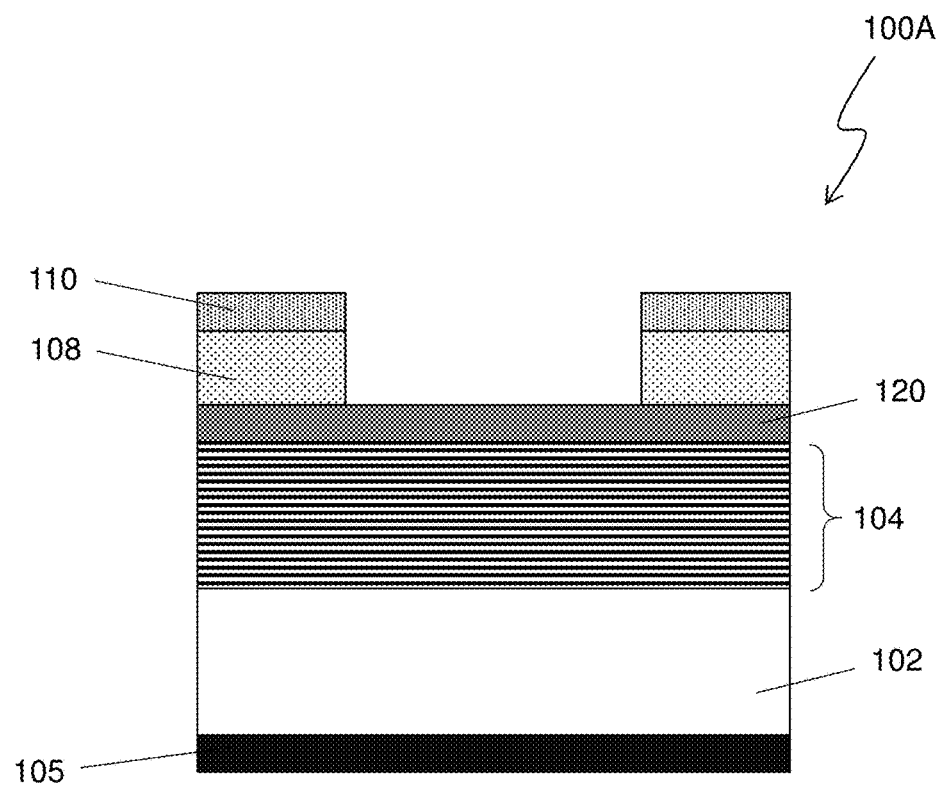
FIG. 3A is a cross sectional view of a reflective photo mask used in an EUV lithography exposing tool in accordance with embodiments of the present disclosure.
Figure 3B:
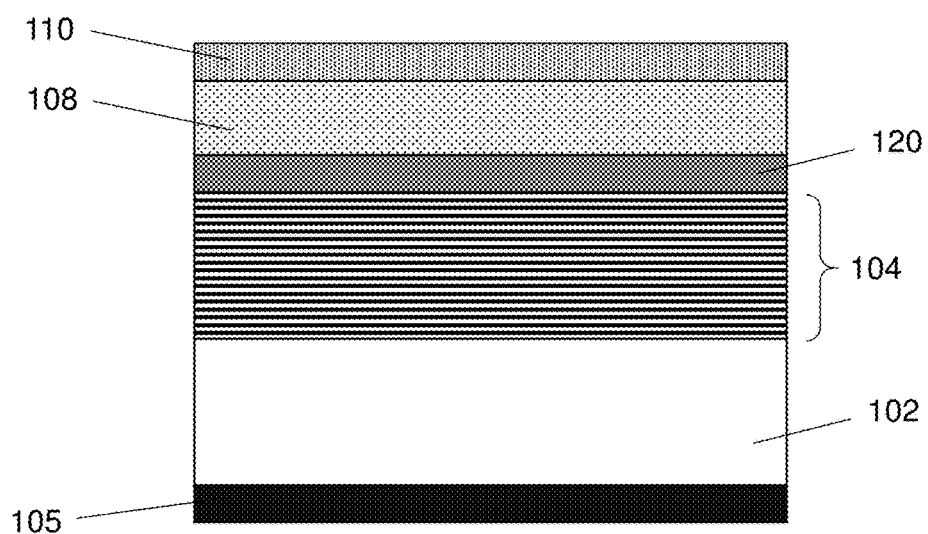
FIG. 3B is a cross sectional view of a mask blank for the reflective photo mask of FIG. 3A.

FIG. 3A is a cross sectional view of a reflective photo mask used in an extreme ultraviolet (EUV) lithography exposing tool in accordance with embodiments of the present disclosure. FIG. 3B is a cross sectional view of a mask blank for the reflective photo mask of FIG. 3A. Materials, configurations, dimensions, processes and/or operations explained with respect to the foregoing embodiments may be employed in the following embodiments, and detailed explanation thereof may be omitted.

An EUV reflective mask 100A shown in FIG. 3A includes a substrate 102, a RML 104 on the substrate, a photo catalytic layer 120 on the RML layer 104, an absorber layer 108 on the photo catalytic layer 120 and a protection layer 110 on the absorber layer 108. No capping layer is disposed between the RML layer 104 and the photo catalytic layer 120. In some embodiments, the photo catalytic layer 120 includes one or more of titanium oxide ($TiO_2$), tin oxide (SnO), zinc oxide (ZnO) and cadmium sulfide (CdS). In certain embodiments, the photo catalytic layer 120 includes tin oxide (SnO), zinc oxide (ZnO) or cadmium sulfide (CdS). The manufacturing process of the EUV photo mask 100A is the same as that explained with respect to FIG. 2 except for the formation of the capping layer 106.

Figure 4:
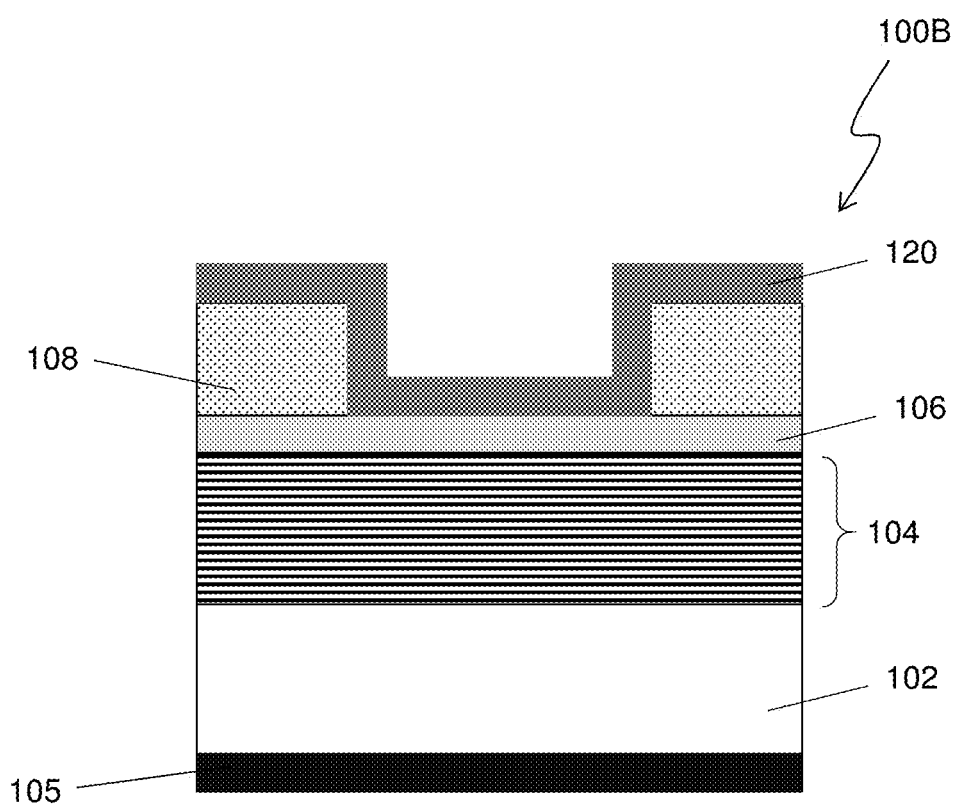
FIG. 4 is a cross sectional view of a reflective photo mask used in an EUV lithography exposing tool in accordance with embodiments of the present disclosure.
Figure 5:
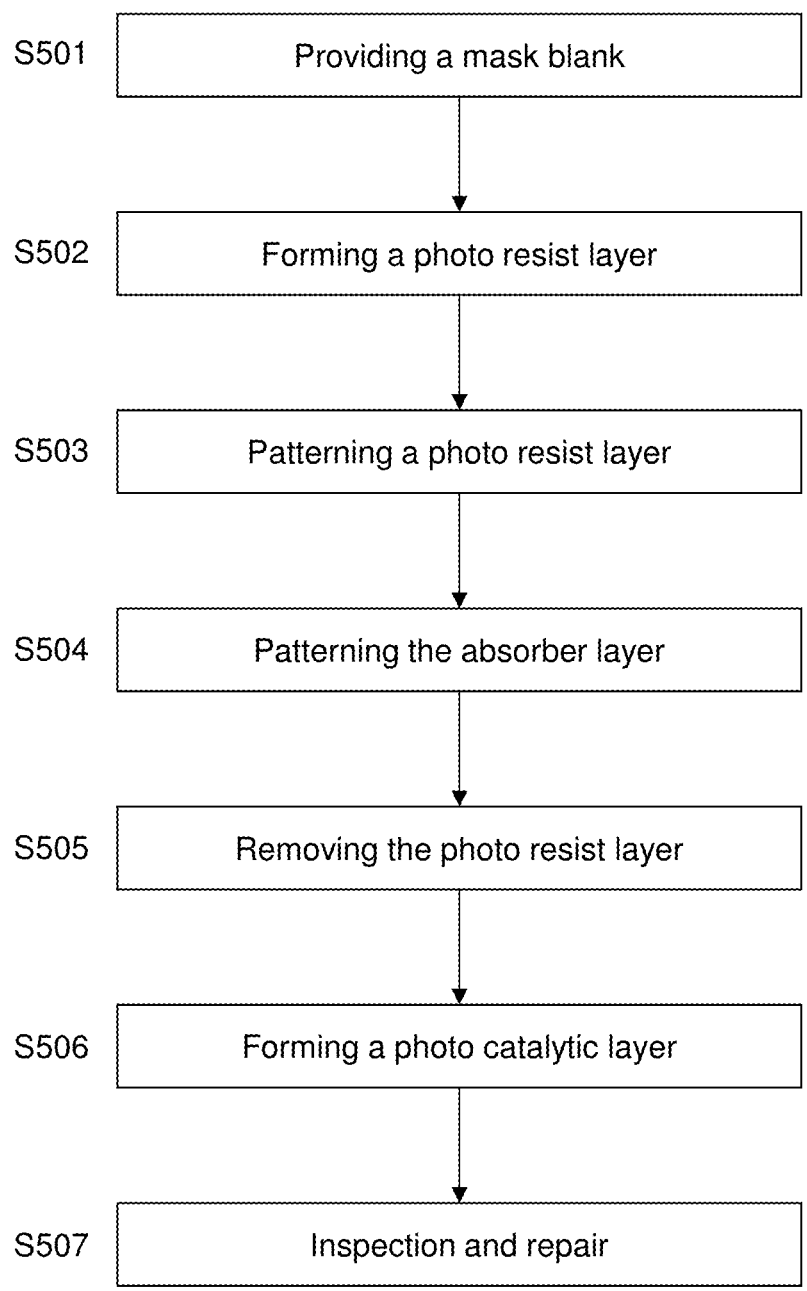
FIG. 5 is a flow chart of a sequential manufacturing process of an EUV reflective mask in accordance with embodiments of the present disclosure.

FIG. 4 is a cross sectional view of a reflective photo mask 110B used in an extreme ultraviolet (EUV) lithography exposing tool in accordance with embodiments of the present disclosure. FIG. 5 is a flowchart of a sequential fabrication method to form the EUV reflective mask 100B shown in FIG. 4, according to embodiments of the present disclosure. It is understood that in the sequential manufacturing process, one or more additional operations can be provided before, during, and after the stages shown in FIG. 5 and some of the operations described below can be replaced or eliminated for additional embodiments of the method. The order of the operations/processes may be interchangeable. Materials, configurations, dimensions, processes and/or operations explained with respect to the foregoing embodiments may be employed in the following embodiments, and detailed explanation thereof may be omitted.

In the embodiment of FIG. 4, a mask blank includes a substrate 102, a RML 104 on the substrate, a capping layer 106 on the RML layer 104, and an absorber layer 108 on the capping layer 106, and does not includes a photo catalytic layer 120. The photo catalytic layer 120 is formed after the absorber layer 108 is patterned as shown in FIG. 4. In this embodiment, the photo catalytic layer 120 functions as not only a photo catalytic layer but also as a protection layer. In some embodiments, a protection layer 110 is formed on the absorber layer 108 and a photo catalytic layer 120 is further formed over the protection layer 110. As shown in FIG. 4, the photo catalytic layer 120 is formed also on sidewalls of the absorber layer 108.

The manufacturing process of the EUV photo mask 100B of FIG. 4 is shown in FIG. 5. At S501 of FIG. 5, a mask blank is prepared. The mask blank includes, a substrate 102, a RML 104 on the substrate, a capping layer 106 on the RML layer 104, and an absorber layer 108 on the capping layer 106. At S502 of FIG. 5, a photo resist (e-beam resist) layer is formed on the mask blank. At S503, the photo resist layer is exposed with actinic radiation, such as electron beam to draw circuit patterns thereon. The exposed photo resist is developed. At S504 of FIG. 5, the absorber layer 108 is patterned by using one or more etching operations using the patterned resist layer as an etching mask, to form the circuit pattern on the EUV mask blank. At S506 of FIG. 5, a photo catalytic layer 120 is formed over the patterned absorber layer 108 and the exposed portions of the capping layer 106. Then, at S507 of FIG. 5, an inspection and repair operation is performed similar to S208 of FIG. 2.

Figure 6A:
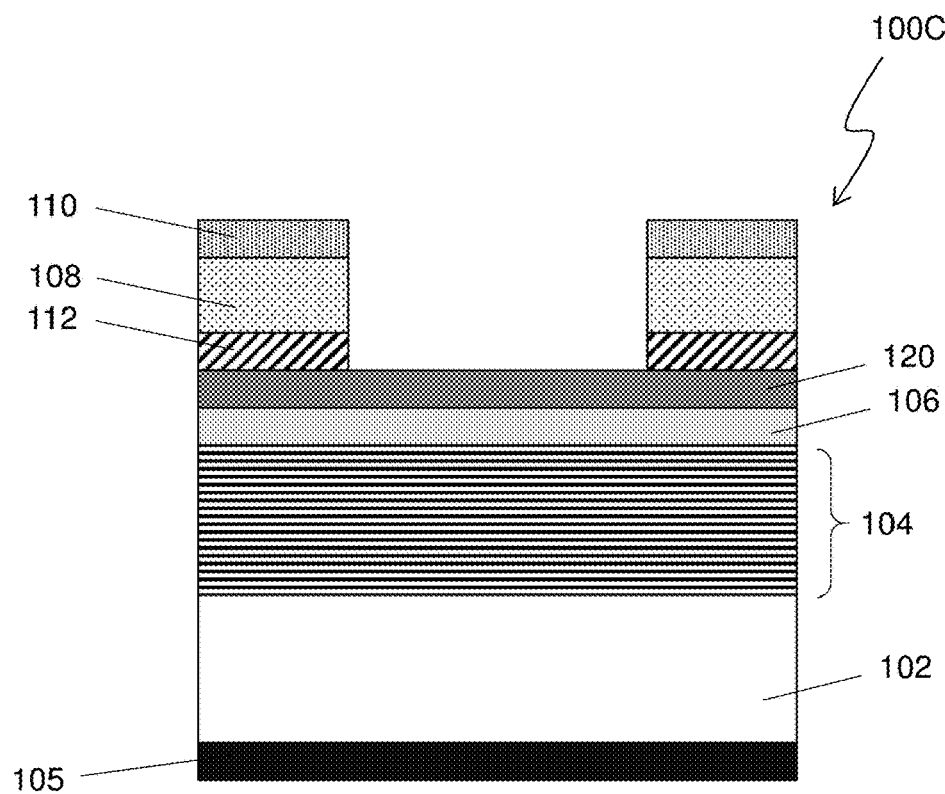
FIG. 6A is a cross sectional view of a reflective photo mask used in an EUV lithography exposing tool in accordance with embodiments of the present disclosure.
Figure 6B:
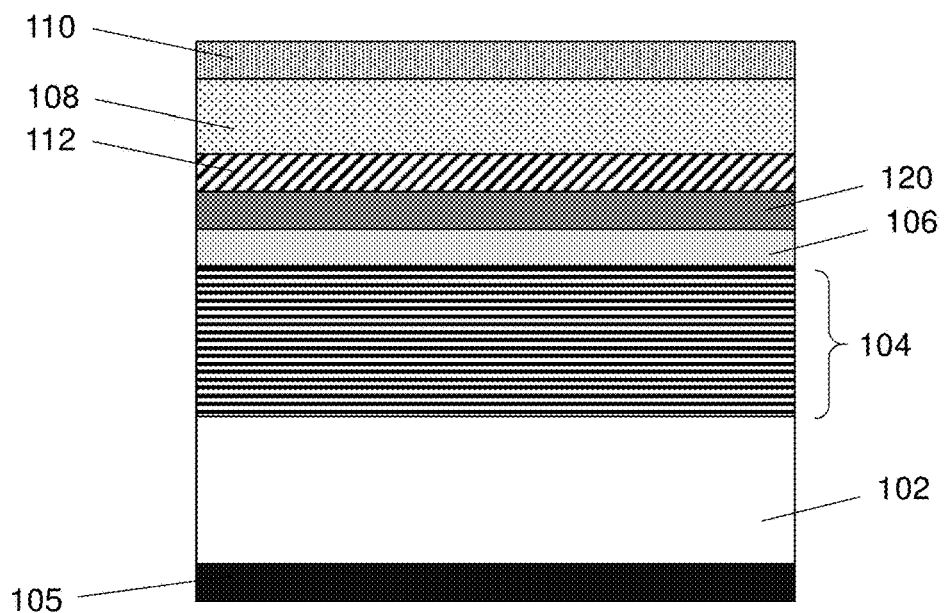
FIG. 6B is a cross sectional view of a mask blank for the reflective photo mask of FIG. 6A.
Figure 7:
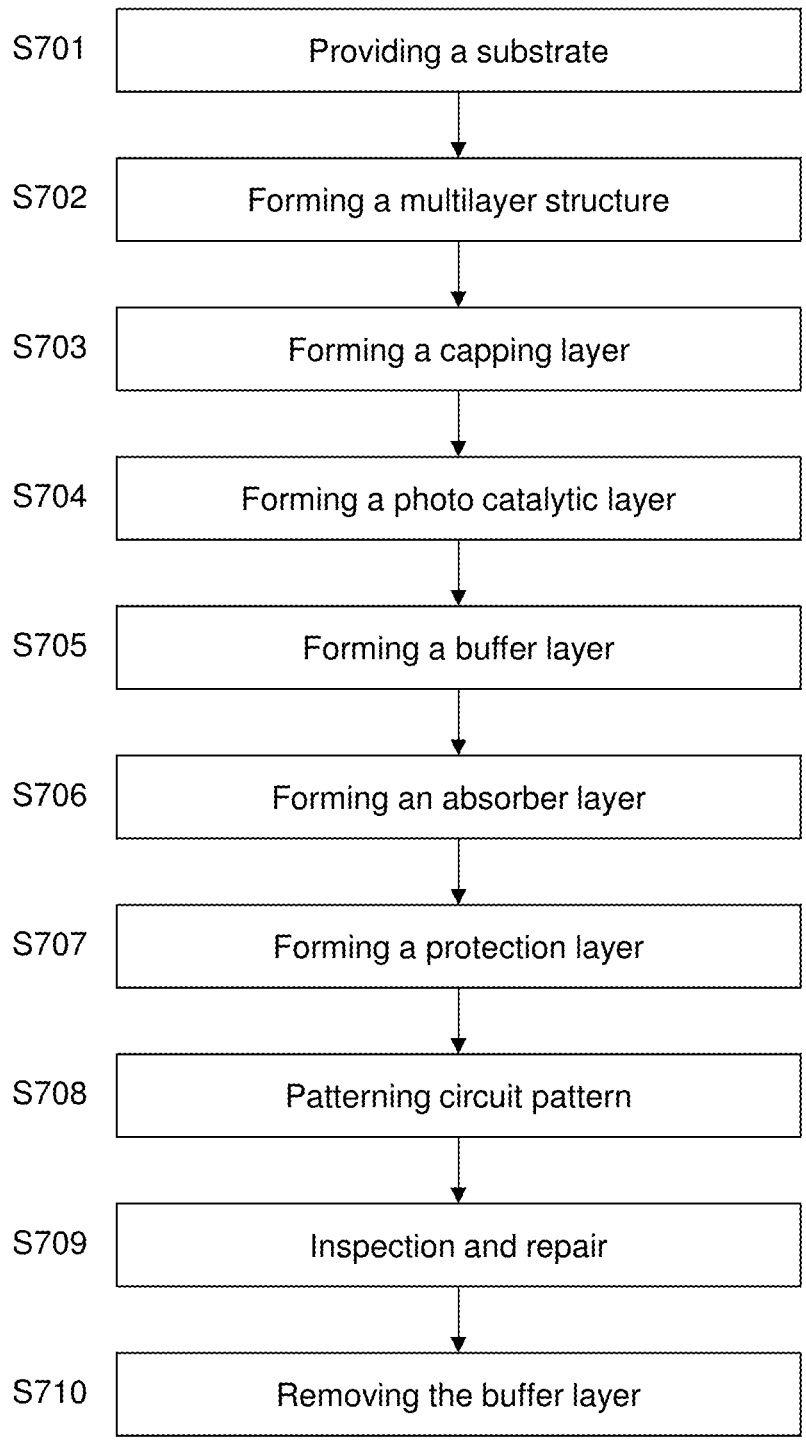
FIG. 7 is a flow chart of a sequential manufacturing process of an EUV reflective mask in accordance with embodiments of the present disclosure.

FIG. 6A is a cross sectional view of a reflective photo mask used in an extreme ultraviolet (EUV) lithography exposing tool in accordance with embodiments of the present disclosure. FIG. 6B is a cross sectional view of a mask blank for the reflective photo mask of FIG. 6A. FIG. 7 is a flowchart of a sequential fabrication method to form an EUV reflective mask 100B shown in FIG. 6A, according to embodiments of the present disclosure. It is understood that in the sequential manufacturing process, one or more additional operations can be provided before, during, and after the stages shown in FIG. 7 and some of the operations described below can be replaced or eliminated for additional embodiments of the method. The order of the operations/processes may be interchangeable. Materials, configurations, dimensions, processes and/or operations explained with respect to the foregoing embodiments may be employed in the following embodiments, and detailed explanation thereof may be omitted.

An EUV reflective mask 100C shown in FIG. 6A includes a substrate 102, a RML 104 on the substrate, a capping layer 106 on the RML layer 104, a photo catalytic layer 120 on the capping layer 106, a buffer layer 112 on the photo catalytic layer 120, an absorber layer 108 on the buffer layer 112 and a protection layer 110 on the absorber layer 108.

The buffer layer 112 functions as an etch stop layer to protect the photo catalytic layer 120 during the etching of the absorber layer 108. In some embodiments, the buffer layer 112 includes one or more layers of Cr, Al, Ta, Ru, CrN, AlN, TaN, SiO$_2$, silicon nitride and other suitable material. In some embodiments, the thickness of the buffer layer 112 is in a range from about 1 nm to about 50 nm and is in a range from about 2 nm to about 10 nm in other embodiments.

The manufacturing process of the EUV photo mask 100C of FIG. 6A is shown in FIG. 7. S701, S702, S703 and S704 of FIG. 7 are the same as S201, S202, S203 and S204 of FIG. 2. At S705 of FIG. 7, a buffer layer 112 is formed over the photo catalytic layer 120. At S706 of FIG. 7, an absorber layer 108 is formed over the buffer layer and at S707 of FIG. 7, a protection layer 110 is formed over the absorber layer 108, thereby forming an EUV mask blank. At S708 of FIG. 7, the protection layer 110 and the absorber layer 108 are patterned by using one or more lithography and etching operations to form a circuit pattern on the EUV mask blank. In the etching operation, the etching substantially stops at the buffer layer 112 and the photo catalytic layer 120 is not exposed. As S709 of FIG. 7, an inspection and repair operation is performed similar to S208 of FIG. 2. Then, at S710 of FIG. 7, the buffer layer not covered by the absorber layer 108 is removed by an appropriate etching operation. In some embodiments, wet etching is used. In some embodiments, no protection layer 110 is formed. In some embodiments, no capping layer 106 is formed.

Figure 8:
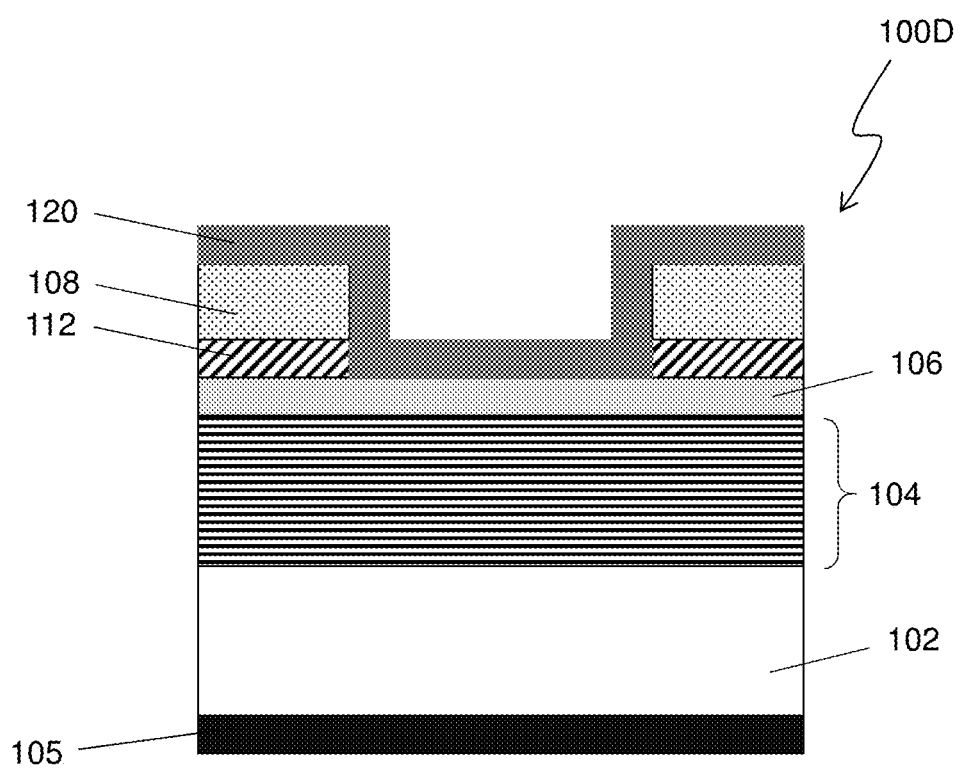
FIG. 8 is a cross sectional view of a reflective photo mask used in an EUV lithography exposing tool in accordance with embodiments of the present disclosure.
Figure 9:
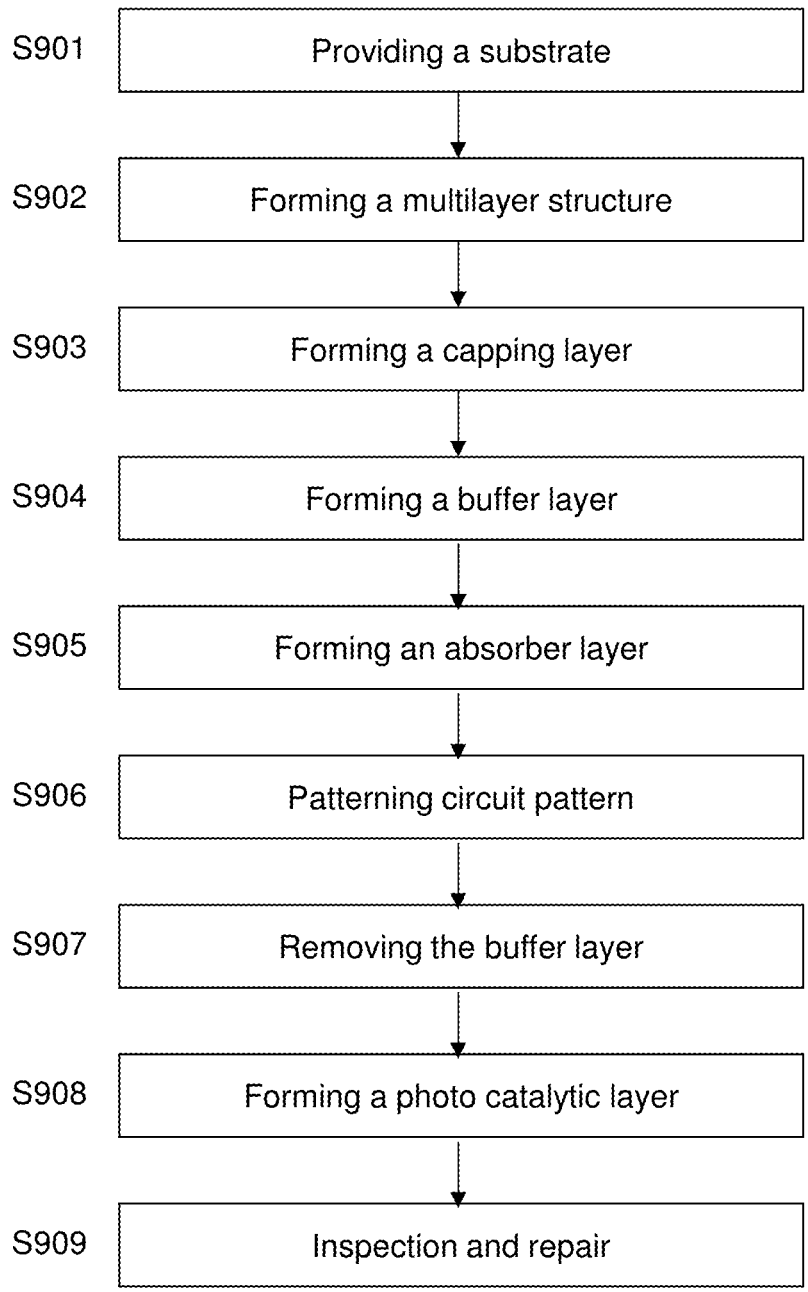
FIG. 9 is a flow chart of a sequential manufacturing process of an EUV reflective mask in accordance with embodiments of the present disclosure.

FIG. 8 is a cross sectional view of a reflective photo mask used in an extreme ultraviolet (EUV) lithography exposing tool in accordance with embodiments of the present disclosure. FIG. 9 is a flowchart of a sequential fabrication method to form an EUV reflective mask 100D shown in FIG. 8, according to embodiments of the present disclosure. It is understood that in the sequential manufacturing process, one or more additional operations can be provided before, during, and after the stages shown in FIG. 9 and some of the operations described below can be replaced or eliminated for additional embodiments of the method. The order of the operations/processes may be interchangeable. Materials, configurations, dimensions, processes and/or operations explained with respect to the foregoing embodiments may be employed in the following embodiments, and detailed explanation thereof may be omitted.

In this embodiment, a mask blank includes a substrate 102, a RML 104 on the substrate, a capping layer 106 on the RML layer 104, a buffer layer 112 on the RML layer and an absorber layer 108 on the buffer layer 112, and does not include a photo catalytic layer 120. The photo catalytic layer 120 is formed after the absorber layer 108 is patterned and the buffer layer 112 is removed. In this embodiment, the photo catalytic layer 120 functions as not only a photo catalytic layer but also as a protection layer. The buffer layer 112 functions as an etch stop layer to protect the capping layer 106 during the etching of the absorber layer 108. In some embodiments, no capping layer 106 is formed. In such a case, the buffer layer 112 functions as an etch stop layer to protect the RML layer 104 during the etching of the absorber layer 108. In some embodiments, a protection layer 110 is formed on the absorber layer 108 and a photo catalytic layer 120 is further formed over the protection layer 110. As shown in FIG. 8, the photo catalytic layer 120 is conformally formed also on sidewalls of the absorber layer 108 and the buffer layer 112.

The manufacturing process of the EUV photo mask 100B of FIG. 8 is shown in FIG. 9. S901, S902 and S903 of FIG. 9 are the same as S201, S202 and S203 of FIG. 2. At S904 of FIG. 9 a buffer layer 112 is formed on the capping layer 106. An absorber layer 108 is formed on the buffer layer at S905 of FIG. 9, thereby a EUV mask blank is obtained. At S906 of FIG. 59 the absorber layer 108 is patterned by using one or more lithography and etching operations to form a circuit pattern on the EUV mask blank. In the etching operation, the etching substantially stops at the buffer layer 112 and the capping layer 106 is not exposed. As S907 of FIG. 9, the exposed buffer layer 112 is removed, and at S908 of FIG. 9, a photo catalytic layer 120 is conformally formed over the patterned absorber layer 108 and the exposed portions of the capping layer 106. Then, at S909 of FIG. 9, an inspection and repair operation is performed similar to S208 of FIG. 2.

Figure 10:
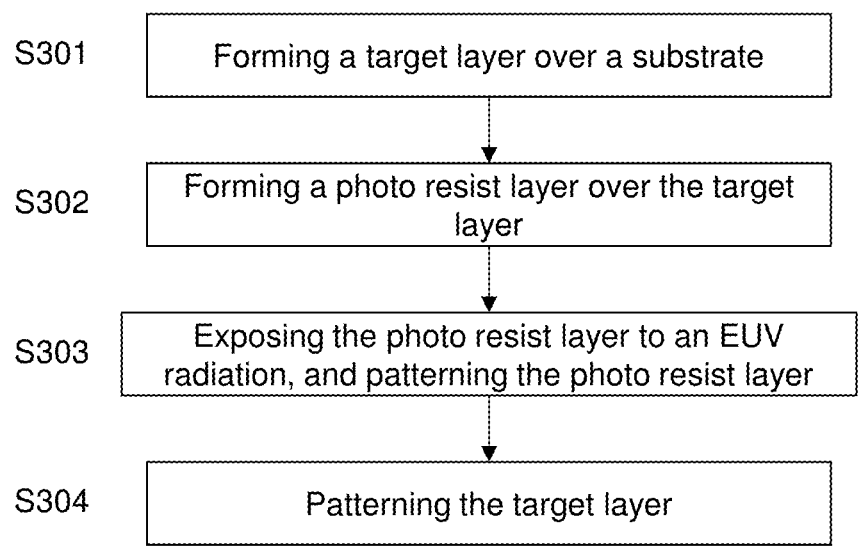
FIG. 10 is a flowchart of a method making an integrated circuit constructed in accordance with embodiments of present disclosure.

FIG. 10 is a flowchart of a sequential manufacturing process of a semiconductor device, such as an integrated circuit, according to embodiments of the present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S301 of FIG. 10, a target layer to be patterned is formed over the semiconductor substrate. In certain embodiments, the target layer is the semiconductor substrate. In some embodiments, the target layer includes a conductive layer, such as a metallic layer or a polysilicon layer, a dielectric layer, such as silicon oxide, silicon nitride, SiON, SiOC, SiOCN, SiCN, hafnium oxide, or aluminum oxide, or a semiconductor layer, such as an epitaxially formed semiconductor layer. In some embodiments, the target layer is formed over an underlying structure, such as isolation structures, transistors or wirings. At S302, of FIG. 10, a photo resist layer is formed over the target layer. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At S303 of FIG. 10, the photoresist layer is patterned using an EUV reflective mask as set forth above. The patterning of the photoresist layer includes performing a photolithography exposing process by an EUV exposing system using the EUV mask. During the exposing process, the integrated circuit (IC) design pattern defined on the EUV mask is imaged to the photoresist layer to form a latent pattern thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

At S304 of FIG. 10, the target layer is patterned utilizing the patterned photoresist layer as an etching mask. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing.

Figure 11:
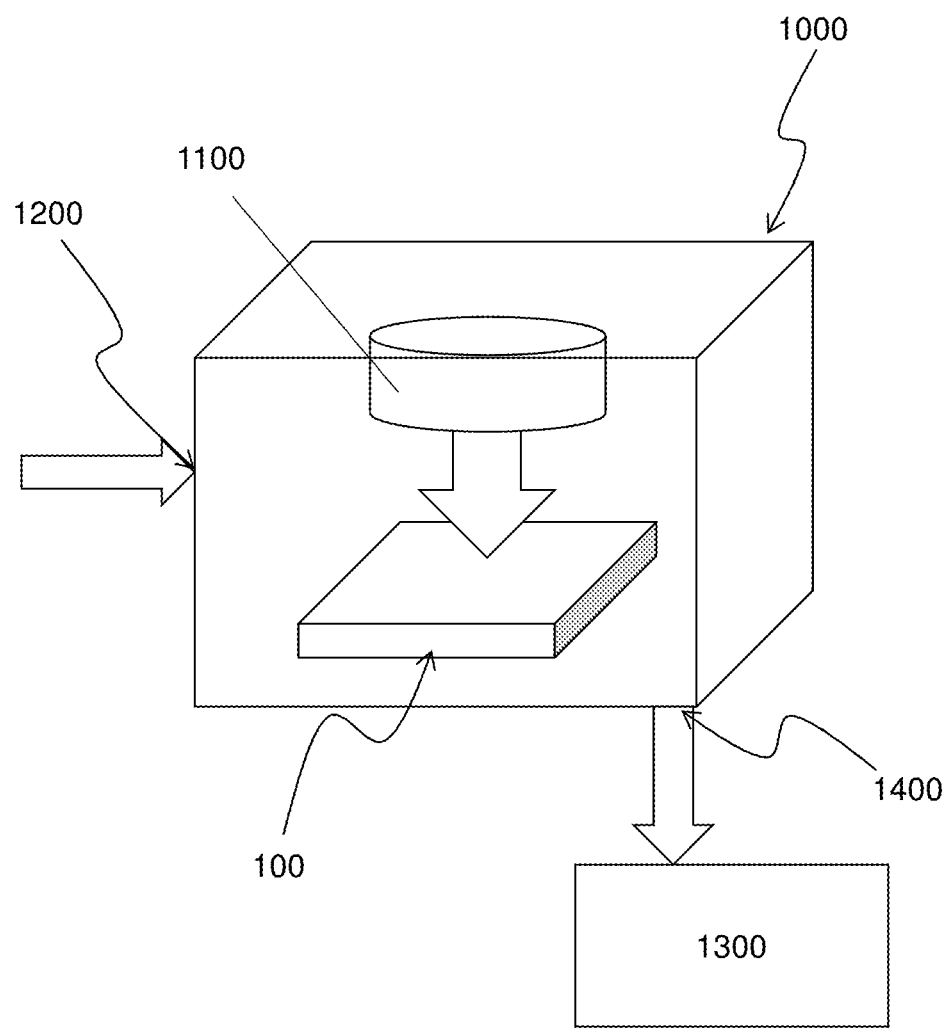
FIG. 11 shows a schematic view of a mask storage in accordance with embodiments of the present disclosure.

In some embodiments, the EUV reflective mask is stored in a chamber (e.g., mask storage) 1000 having a light source 1100, such as a UV lamp or a DUV lamp, which irradiates the EUV reflective mask 100, 100A, 100B, 100C and/or 100D, to decompose and remove hydrocarbon contaminants on the mask, as shown in FIG. 11. In some embodiments, an inert gas is supplied from a gas inlet 1200 and the storage is pumped by a pump 1300 from a gas outlet 1400. In some embodiments, an oxygen gas is added to the inert gas. The light is irradiated within the chamber or from outside the chamber through a glass or quartz window.

The present disclosure provides a reflective mask and the method of making the same in order to decompose hydrocarbon contamination on the mask during a lithography operation. In some embodiments, a photo catalytic layer is formed on the EUV reflective mask, and the carbon contamination deposited on the photo catalytic layer is cleaned by the EUV radiation during the EUV lithography operation. In other embodiments, the EUV reflective mask is cleaned with a UV radiation or a deep UV (DUV) radiation inside or outside the EUV lithography tool. The decomposition of the hydrocarbon can prevent undesirable absorption of the EUV light by the contaminants and increase lifetime of the EUV mask.

It will be understood that not all advantages have been necessarily discussed herein, no particular advantage is required for all embodiments or examples, and other embodiments or examples may offer different advantages.

In accordance with one aspect of the present disclosure, a reflective mask includes a substrate, a reflective multilayer disposed on the substrate, a capping layer disposed on the reflective multilayer, a photo catalytic layer disposed on the capping layer, and an absorber layer disposed on the photo catalytic layer and carrying circuit patterns having openings. Part of the photo catalytic layer is exposed at the openings of the absorber layer, and the photo catalytic layer includes one selected from the group consisting of titanium oxide ($TiO_2$), tin oxide (SnO), zinc oxide (ZnO) and cadmium sulfide (CdS). In one or more of the foregoing and the following embodiments, the capping layer includes ruthenium or an alloy of ruthenium. In one or more of the foregoing and the following embodiments, the alloy of ruthenium is an alloy of ruthenium and at least one selected from the group consisting of Po, Hg, Os, Rh, Pd, Jr, and Pt. In one or more of the foregoing and the following embodiments, the photo catalytic layer includes one selected from the group consisting of tin oxide (SnO), zinc oxide (ZnO) and cadmium sulfide (CdS). In one or more of the foregoing and the following embodiments, a thickness of the photo catalytic layer is in a range from 2 nm to 10 nm. In one or more of the foregoing and the following embodiments, the reflective mask further includes a protection layer disposed over the absorber layer and made of one selected from the group consisting of Ru, a Ru alloy, titanium oxide, zirconium oxide, silicon oxide, titanium nitride, zirconium nitride and silicon nitride. In one or more of the foregoing and the following embodiments, the reflective mask further includes a buffer layer between the photo catalytic layer and the absorber layer. In one or more of the foregoing and the following embodiments, the buffer layer includes one selected from the group consisting of Cr, Al, Ta, Ru, CrN, AlN, TaN, $SiO_2$ and silicon nitride.

In accordance with another aspect of the present disclosure, a reflective mask includes a substrate, a reflective multilayer disposed on the substrate, an absorber layer disposed over the reflective multilayer and carrying circuit patterns having openings, and a photo catalytic layer disposed on the absorber layer and over the reflective multilayer at the openings of the absorber layer. The photo catalytic layer includes one selected from the group consisting of titanium oxide ($TiO_2$), tin oxide (SnO), zinc oxide (ZnO) and cadmium sulfide (CdS). In one or more of the foregoing and the following embodiments, the reflective mask further includes a capping layer between the reflective multilayer and the absorber layer. The photo catalytic layer is disposed over the capping layer. In one or more of the foregoing and the following embodiments, the capping layer includes ruthenium or an alloy of ruthenium. In one or more of the foregoing and the following embodiments, the alloy of ruthenium is an alloy of ruthenium and at least one selected from the group consisting of Po, Hg, Os, Rh, Pd, Jr, and Pt. In one or more of the foregoing and the following embodiments, a thickness of the photo catalytic layer is in a range from 2 nm to 10 nm. In one or more of the foregoing and the following embodiments, the reflective mask further includes a buffer layer between the reflective multilayer and the absorber layer. In one or more of the foregoing and the following embodiments, the buffer layer includes one selected from the group consisting of Cr, Al, Ta, Ru, CrN, AlN, TaN, $SiO_2$ and silicon nitride. In one or more of the foregoing and the following embodiments, the photo catalytic layer is formed on sidewalls of the absorber layer and the buffer layer.

In accordance with another aspect of the present disclosure, a reflective mask includes a substrate, a reflective multilayer disposed on the substrate, a photo catalytic layer disposed on the reflective multilayer, and an absorber layer disposed on the photo catalytic layer and carrying circuit patterns. Part of the photo catalytic layer is exposed at opening of the absorber layer, and the photo catalytic layer includes one selected from the group consisting of tin oxide (SnO), zinc oxide (ZnO) and cadmium sulfide (CdS). In one or more of the foregoing and the following embodiments, a thickness of the photo catalytic layer is in a range from 2 nm to 10 nm. In one or more of the foregoing and the following embodiments, the reflective mask further includes a protection layer disposed over the absorber layer and made of one selected from the group consisting of Ru, a Ru alloy, titanium oxide, zirconium oxide, silicon oxide, titanium nitride, zirconium nitride and silicon nitride. In one or more of the foregoing and the following embodiments, the reflective mask further includes a buffer layer between the reflective multilayer and the absorber layer, and the buffer layer includes one selected from the group consisting of Cr, Al, Ta, Ru, CrN, AlN, TaN, SiO$_2$ and silicon nitride.

In accordance with another aspect of the present disclosure, in a method of manufacturing a reflective mask, a photo resist layer is formed over a mask blank. The mask blank includes a substrate, a reflective multilayer on the substrate, and absorber layer on the reflective multilayer. The photo resist layer is patterned, the absorber layer is patterned by using the patterned photo resist layer, and a photo catalytic layer is formed over the patterned absorber layer. The absorber layer carries circuit patterns having openings. The photo catalytic layer is formed over the reflective multilayer at the openings of the absorber layer. The photo catalytic layer includes one selected from the group consisting of titanium oxide (TiO$_2$), tin oxide (SnO), zinc oxide (ZnO) and cadmium sulfide (CdS). In one or more of the foregoing and the following embodiments, the mask blank further includes a capping layer between the reflective multilayer and absorber layer. The patterning the absorber layer includes an etching operation, and the etching operation stops at the capping layer. The capping layer includes ruthenium or an alloy of ruthenium. In one or more of the foregoing and the following embodiments, the mask blank further includes a buffer layer between the capping layer and absorber layer, and the patterning the absorber layer includes an etching operation, and the etching operation stops at the buffer layer. In one or more of the foregoing and the following embodiments, before the photo catalytic layer is formed, the buffer layer exposed at the openings is removed.

In accordance with another aspect of the present disclosure, in a method of cleaning a reflective mask, the reflective mask is placed into a chamber. The reflective mask includes a photo catalytic layer. The photo catalytic layer is irradiated with ultra violet light or deep ultra violet light. Contamination on the reflective mask is decomposed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reflective mask, comprising:
a substrate;
a reflective multilayer disposed on the substrate;
a capping layer disposed on the reflective multilayer;
a photo catalytic layer disposed on the capping layer; and
an absorber layer disposed on the photo catalytic layer and carrying circuit patterns having openings, wherein:
a part of the photo catalytic layer is exposed at the openings of the absorber layer, and a part of the photo catalytic layer is disposed between the capping layer and absorber layer, and
the photo catalytic layer includes one selected from the group consisting of titanium oxide (TiO$_2$), tin oxide (SnO), zinc oxide (ZnO) and cadmium sulfide (CdS).

2. The reflective mask of claim 1, wherein the capping layer includes ruthenium or an alloy of ruthenium.

3. The reflective mask of claim 2, wherein the alloy of ruthenium is an alloy of ruthenium and at least one selected from the group consisting of Po, Hg, Os, Rh, Pd, Ir, Nb, and Pt.

4. The reflective mask of claim 1, wherein the photo catalytic layer includes one selected from the group consisting of tin oxide (SnO), zinc oxide (ZnO) and cadmium sulfide (CdS).

5. The reflective mask of claim 1, wherein a thickness of the photo catalytic layer is in a range from 2 nm to 10 nm.

6. The reflective mask of claim 1, further comprising a protection layer disposed on the absorber layer and made of one selected from the group consisting of Ru, a Ru alloy, titanium oxide, zirconium oxide, silicon oxide, titanium nitride, zirconium nitride and silicon nitride.

7. The reflective mask of claim 1, further comprising a buffer layer between the photo catalytic layer and the absorber layer.

8. The reflective mask of claim 7, wherein the buffer layer includes one selected from the group consisting of Cr, Al, Ta, Ru, CrN, AN, TaN, SiO$_2$ and silicon nitride.

9. A reflective mask, comprising:
a substrate;
a reflective multilayer disposed on the substrate;
an absorber layer disposed over the reflective multilayer and carrying circuit patterns having openings;
a photo catalytic layer disposed over the absorber layer and over the reflective multilayer at the openings of the absorber layer; and
a buffer layer between the photo catalytic layer and the absorber layer,
wherein the photo catalytic layer includes one selected from the group consisting of titanium oxide (TiO$_2$), tin oxide (SnO), zinc oxide (ZnO) and cadmium sulfide (CdS).

10. The reflective mask of claim 9, further comprising a capping layer between the reflective multilayer and the absorber layer,
wherein the photo catalytic layer is disposed over the capping layer.

11. The reflective mask of claim 10, wherein the capping layer includes ruthenium or an alloy of ruthenium.

12. The reflective mask of claim 11, wherein the alloy of ruthenium is an alloy of ruthenium and at least one selected from the group consisting of Po, Hg, Os, Rh, Pd, Ir, Nb, and Pt.

13. The reflective mask of claim 9, wherein a thickness of the photo catalytic layer is in a range from 2 nm to 10 nm.

14. The reflective mask of claim 9, wherein side surfaces of the absorber layer, the buffer layer and the reflective multilayer are exposed.

15. The reflective mask of claim 9, wherein the buffer layer includes one selected from the group consisting of Cr, Al, Ta, Ru, CrN, AN, TaN, SiO$_2$ and silicon nitride.

16. The reflective mask of claim 9, wherein the photo catalytic layer is continuously formed on sidewalls of the absorber layer and the buffer layer from the photo catalytic layer disposed at the openings of the absorber layer.

17. A reflective mask, comprising:
a substrate;
a reflective multilayer disposed on the substrate;
a photo catalytic layer disposed directly on the reflective multilayer; and
an absorber layer disposed on the photo catalytic layer and carrying circuit patterns, wherein:
part of the photo catalytic layer is exposed at opening of the absorber layer, and the photo catalytic layer includes one selected from the group consisting of tin oxide (SnO), zinc oxide (ZnO) and cadmium sulfide (CdS).

18. The reflective mask of claim 17, wherein a thickness of the photo catalytic layer is in a range from 2 nm to 10 nm.

19. The reflective mask of claim 17, further comprising a protection layer disposed over the absorber layer and made of one selected from the group consisting of Ru, a Ru alloy, titanium oxide, zirconium oxide, silicon oxide, titanium nitride, zirconium nitride and silicon nitride.

20. The reflective mask of claim 17, further comprising a buffer layer between the reflective multilayer and the absorber layer,
  wherein the buffer layer consists of one selected from the group consisting of Cr, Al, Ta, Ru, CrN, AN, TaN, $SiO_2$ and silicon nitride.

\* \* \* \* \*